United States Patent
Someya et al.

(10) Patent No.: US 11,978,941 B2
(45) Date of Patent: May 7, 2024

(54) BIAS TEE CIRCUIT AND PoC CIRCUIT USING THE SAME

(71) Applicant: TDK CORPORATION, Tokyo (JP)

(72) Inventors: Shuhei Someya, Tokyo (JP); Mitsuyuki Nara, Tokyo (JP); Katsufumi Ehata, Tokyo (JP); Shinichi Tsuchiya, Tokyo (JP); Hirofumi Tomita, Tokyo (JP); Yoshinobu Shimokura, Tokyo (JP)

(73) Assignee: TDK CORPORATION, Tokyo (JP)

( * ) Notice: Subject to any disclaimer, the term of this patent is extended or adjusted under 35 U.S.C. 154(b) by 317 days.

(21) Appl. No.: 17/399,721

(22) Filed: Aug. 11, 2021

(65) Prior Publication Data
US 2022/0060342 A1 Feb. 24, 2022

(30) Foreign Application Priority Data
Aug. 19, 2020 (JP) .................................. 2020-138351

(51) Int. Cl.
*H01P 1/20* (2006.01)
*H03H 7/01* (2006.01)
*H04L 12/10* (2006.01)
*H04L 12/40* (2006.01)

(52) U.S. Cl.
CPC ......... *H01P 1/2007* (2013.01); *H03H 7/0115* (2013.01); *H04L 12/10* (2013.01); *H04L 12/40045* (2013.01)

(58) Field of Classification Search
CPC ...... H01P 1/2007; H03H 7/0115; H04L 12/10
USPC .......................... 333/175, 176, 202, 206, 207
See application file for complete search history.

(56) References Cited

U.S. PATENT DOCUMENTS

| 7,012,486 B2* | 3/2006 | Ji .......................... H01F 27/027 333/185 |
| 2006/0022771 A1 | 2/2006 | Ji |
| 2012/0021790 A1* | 1/2012 | Kister ...................... H04B 1/18 455/507 |
| 2018/0131330 A1 | 5/2018 | Itabashi |
| 2022/0094028 A1 | 3/2022 | Uematsu et al. |

FOREIGN PATENT DOCUMENTS

| JP | 2007241142 A | 9/2007 |
| JP | 2010-232988 A | 10/2010 |

* cited by examiner

*Primary Examiner* — Rakesh B Patel
(74) *Attorney, Agent, or Firm* — YOUNG LAW FIRM, P.C.

(57) ABSTRACT

Disclosed herein is a bias tee circuit connected between a common terminal and power supply and signal terminals, the bias tee circuit includes a capacitor inserted between the common terminal and the signal terminal, and first and second inductors inserted in series between the common terminal and the power supply terminal. The first inductor is connected on a side of the common terminal. The second inductor is connected on a side of the power supply terminal. The second inductor is higher in self-resonance frequency and lower in Q value than the first inductor.

8 Claims, 3 Drawing Sheets

BIAS TEE CIRCUIT AND PoC CIRCUIT USING THE SAME

BACKGROUND OF THE INVENTION

Field of the Invention

The present invention relates to a bias tee circuit and a PoC circuit using the bias tee circuit and, more particularly, to a bias tee circuit having a reduced number of components and a PoC circuit using such a bias tee circuit.

Description of Related Art

The PoC (Power over Coax) method, which is a method that enables transmission of a signal and a power supply over a single coaxial cable in a superimposing manner, has recently been prevailing mainly in the field of on-vehicle electronic devices. A PoC circuit requires a bias tee circuit for separating a signal component and a DC power supply component from each other. An example of the bias tee circuit is disclosed in JP 2007-241142A.

However, the bias tee circuit described in FIG. 4 of JP 2007-241142A uses three series-connected inductors, which is disadvantageous from a viewpoint of reduction in the number of components. Further, the bias tee circuit described in FIG. 1 of JP 2007-241142A has a configuration in which an inductor and a resistor are connected to a high-frequency signal line, so that a stray capacitance to be added to the high-frequency signal line increases due to an increase in the number of land patterns, with the result that high-frequency characteristics deteriorate.

SUMMARY

It is therefore an object of the present invention to provide a bias tee circuit capable of achieving excellent high-frequency characteristics while reducing the number of components and a PoC circuit using such a bias tee circuit.

A bias tee circuit according to the present invention is a bias tee circuit connected between a common terminal and power supply and signal terminals and includes a capacitor inserted between the common terminal and the signal terminal and first and second inductors inserted in series between the common terminal and the power supply terminal. The first inductor is connected on the side of the common terminal, and the second inductor is connected on the side of the power supply terminal. The second inductor is higher in self-resonance frequency and lower in Q value than the first inductor.

According to the present invention, the two series-connected inductors are used, so that the number of components can be reduced and, further, there is no need to additionally provide a land pattern, making it possible to prevent high frequency characteristics from deteriorating due to an increase in stray capacitance. Moreover, the second inductor is high in self-resonance frequency and low in Q value and thus can compensate for reduction in a resistance component in a high frequency band without significantly affecting an impedance curve obtained by the first inductor.

In the present invention, the second inductor may be realized by a ferrite bead. This can sufficiently reduce the Q value of the second inductor.

A PoC circuit according to the present invention includes a first circuit group, a second circuit group, and a coaxial cable. The first circuit group includes a first power supply circuit, a first signal processing circuit, and a first bias tee circuit, wherein a power supply terminal included in the first bias tee circuit is connected to the first power supply circuit, and a signal terminal included in the first bias tee circuit is connected to the first signal processing circuit. The second circuit group includes a second power supply circuit, a second signal processing circuit, and a second bias tee circuit, wherein a power supply terminal included in the second bias tee circuit is connected to the second power supply circuit, and a signal terminal included in the second bias tee circuit is connected to the second signal processing circuit. The coaxial cable connects a common terminal included in the first bias tee circuit and a common terminal included in the second bias tee circuit. The first and second bias tee circuits each have the configuration of the above-described bias tee circuit.

According to the present invention, a PoC circuit having a reduced number of components and achieving excellent high-frequency characteristics can be provided.

As described above, according to the present invention, there can be provided a bias tee circuit capable of achieving excellent high-frequency characteristics while reducing the number of components and a PoC circuit using such a bias tee circuit.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
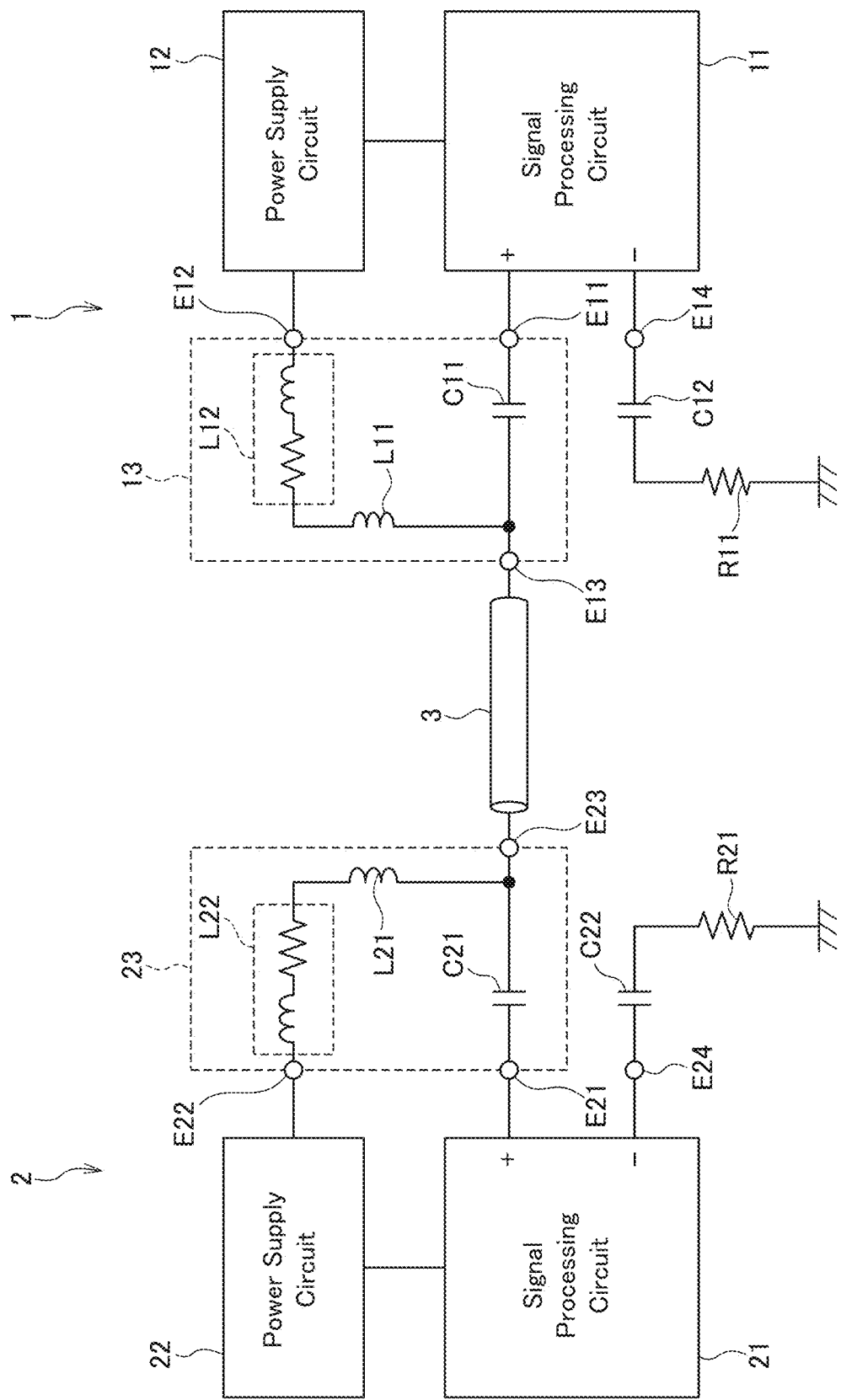
FIG. 1 is a circuit diagram of a PoC circuit according to an embodiment of the present invention.

FIG. 1 is a circuit diagram of a PoC circuit according to an embodiment of the present invention.

The PoC circuit illustrated in FIG. 1 includes a first circuit group 1, a second circuit group 2, and a coaxial cable 3 connecting the first and second circuit groups 1 and 2. The first circuit group 1 includes a signal processing circuit 11, a power supply circuit 12, and a bias tee circuit 13. Similarly, the second circuit group 2 includes a signal processing circuit 21, a power supply circuit 22, and a bias tee circuit 23. The coaxial cable transmits a signal exchanged between the signal processing circuits 11 and 21 and supplies DC power from the power supply circuit 12 to the power supply circuit 22 (or from the power supply circuit 22 to the power supply circuit 12). The bias tee circuits 13 and 23 separate a high-frequency signal and a DC power supply component exchanged through the coaxial cable 3 from each other.

The bias tee circuit 13 includes a capacitor C11 inserted between a common terminal E13 and a signal terminal E11 and inductors L11 and L12 inserted in series between the common terminal E13 and a power supply terminal E12. The capacitor C11 blocks a DC power supply component while allowing a high-frequency signal to pass therethrough. The inductors L11 and L12 block a high-frequency signal component while allowing a DC power supply component to pass therethrough. As illustrated in FIG. 1, the inductor L11 is connected on the side of the common terminal E13, while the inductor L12 is connected on the side of the power supply terminal E12. The signal terminal E11 is connected to the signal processing circuit 11, the power supply terminal E12 is connected to the power supply circuit 12, and the common terminal E13 is connected to one end of the coaxial cable 3. A reference terminal E14 of the signal processing circuit 11 serves as a reference for a signal input and output through the signal terminal E11 and is grounded through a capacitor C12 and a resistor R11.

The bias tee circuit 23 includes a capacitor C21 inserted between a common terminal E23 and a signal terminal E21 and inductors L21 and L22 inserted in series between the common terminal E23 and a power supply terminal E22. The capacitor C21 blocks a DC power supply component while allowing a high-frequency signal to pass therethrough. The inductors L21 and L22 block a high-frequency signal component while allowing a DC power supply component to pass therethrough. As illustrated in FIG. 1, the inductor L21 is connected on the side of the common terminal E23, while the inductor L22 is connected on the side of the power supply terminal E22. The signal terminal E21 is connected to the signal processing circuit 21, the power supply terminal E22 is connected to the power supply circuit 22, and the common terminal E23 is connected to the other end of the coaxial cable 3. A reference terminal E24 of the signal processing circuit 21 serves as a reference for a signal input and output through the signal terminal E21 and is grounded through a capacitor C22 and a resistor R21.

The inductors L11 and L21 have a high Q value, while the inductors L12 and L22 have a low Q value and can be equivalently represented by a series circuit having an inductor and a resistor. The inductors L11 and L21 prevent a high-frequency signal exchanged through the coaxial cable 3 from flowing into the power supply circuits 12 and 22, and the self-resonance frequencies thereof are selected based on the frequency of the high-frequency signal exchanged through the coaxial cable 3. On the other hand, the inductors L12 and L22 compensate for reduction in a resistance component in a higher frequency band than the self-resonance frequencies of the inductors L11 and L21 without significantly affecting the impedance characteristics of the bias tee circuits 13 and 23 obtained by the inductors L11 and L21. To achieve this, the inductors L12 and L22 are higher in self-resonance frequency and lower in Q value than the inductors L11 and L21. The inductors L12 and L22 having such characteristics may be realized by a ferrite bead.

Figure 2:
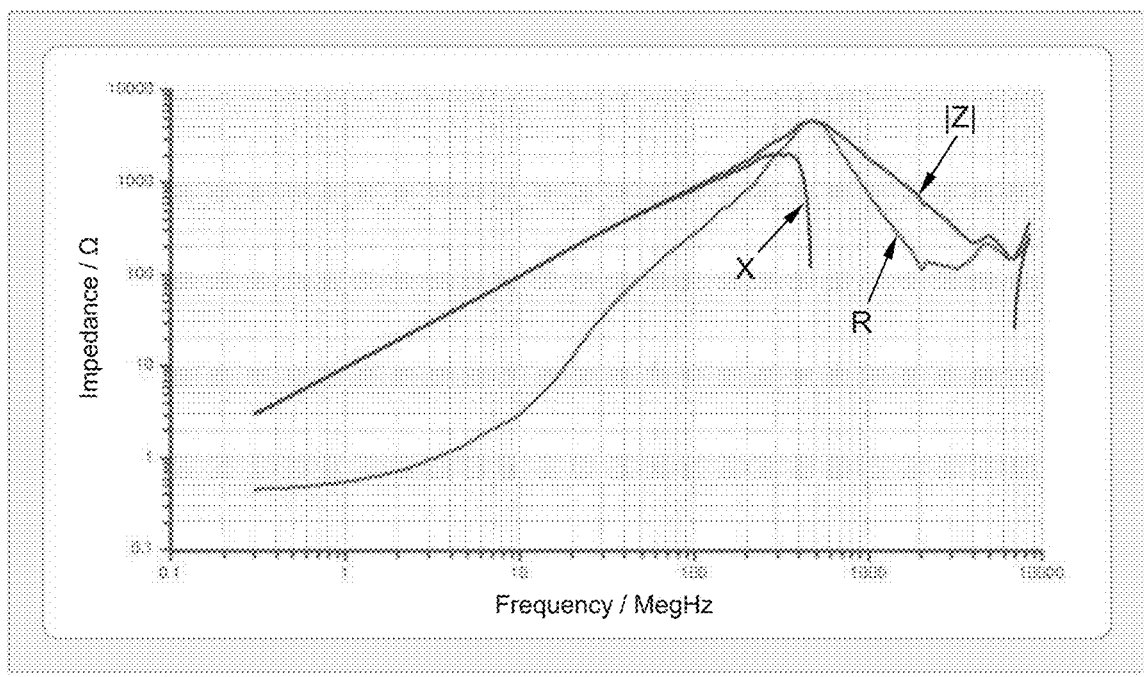
FIG. 2 is a graph illustrating the frequency characteristics of the bias tee circuits 13 and 23.
Figure 3:
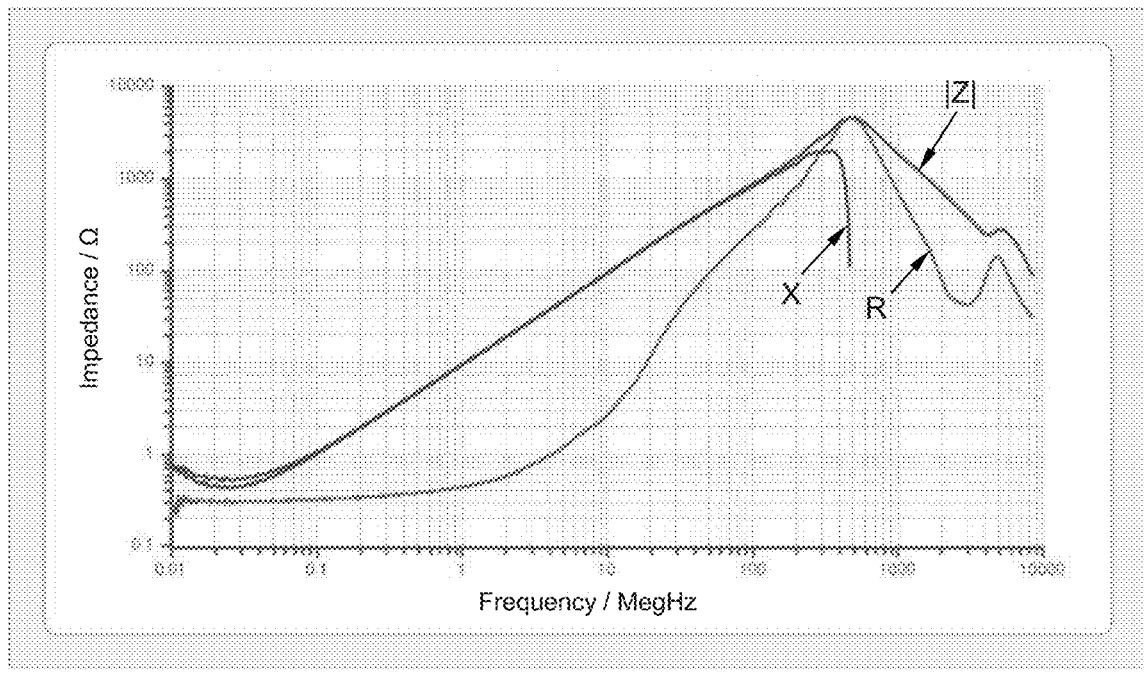
FIG. 3 is a graph illustrating frequency characteristics obtained when the inductors L12 and L22 are removed from the bias tee circuits 13 and 23.

FIG. 2 is a graph illustrating the frequency characteristics of the bias tee circuits 13 and 23, and FIG. 3 is a graph illustrating frequency characteristics obtained when the inductors L12 and L22 are removed from the bias tee circuits 13 and 23. In the graphs of FIGS. 2 and 3, |Z| denotes the absolute value of an impedance component, R denotes a resistance component in the impedance, and X denotes a reactance component in the impedance.

As illustrated in FIG. 2, the impedance component |Z| of the bias tee circuits 13 and 23 has frequency characteristics with a peak at about 500 MHz. Such an impedance curve is obtained by the inductors L11 and L21. However, as illustrated in FIG. 3, in a configuration where only the inductors L11 and L21 are provided, the resistance component R significantly decreases in a higher frequency band than the self-resonance frequency. When the resistance component R decreases in a high-frequency band, a resonance may occur in a high-frequency band due to characteristic impedance deviation on a signal line. The reduction in the resistance component R can be compensated for by connecting the inductors L12 and L22 having a low Q value to the subsequent stages of the respective inductors L11 and L21.

Figure 4:
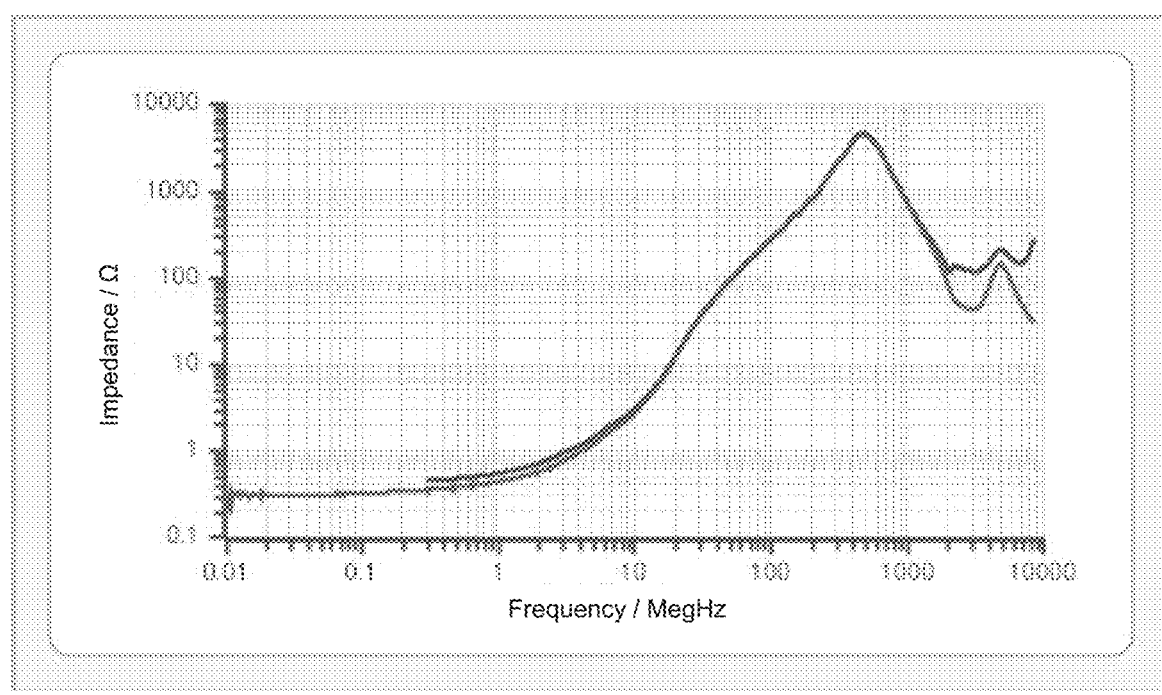
FIG. 4 is a graph in which the resistance components R illustrated in FIGS. 2 and 3 are overlaid each other.
Figure 5:
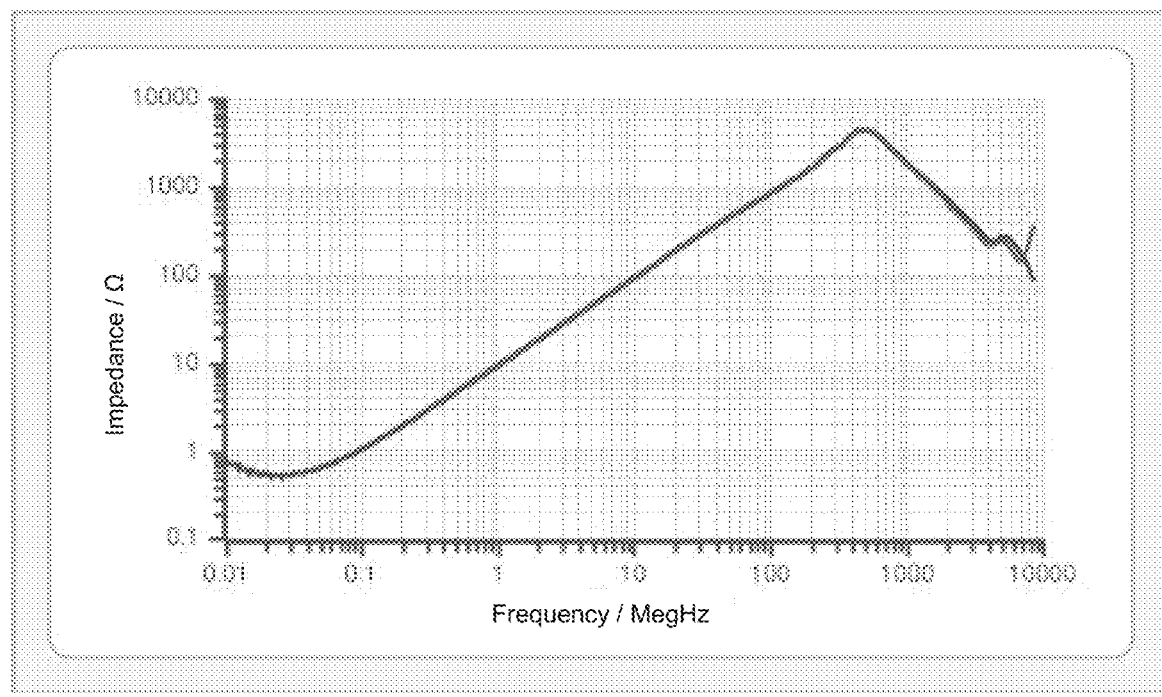
FIG. 5 is a graph in which the impedance components |Z| illustrated in FIGS. 2 and 3 are overlaid each other.

FIG. 4 is a graph in which the resistance components R illustrated in FIGS. 2 and 3 are overlaid each other, and FIG. 5 is a graph in which the impedance components |Z| illustrated in FIGS. 2 and 3 are overlaid each other. The graphs of FIGS. 4 and 5 reveal that when the inductors L12 and L22 having a low Q value are connected to the subsequent stages of the respective inductors L11 and L12, the reduction in the resistance component R in a high-frequency band is mitigated while little affecting the impedance curve.

As described above, in the bias tee circuits 13 and 23 included in the PoC circuit according to the present embodiment, the inductors L12 and L22 low in Q value and high in self-resonance frequency are connected to the subsequent stages of the respective inductors L11 and L21 high in Q value and low in self-resonance frequency. With this configuration, a reduction in the resistance component R in a high frequency band can be mitigated by the inductors L12 and L22, while a desired impedance curve can be kept by the inductors L11 and L21. Further, the bias tee circuits 13 and 23 are each constituted by two inductors, reducing the number of components.

There can also be considered a method of connecting damping resistors in parallel respectively to the inductors L11 and L12 as a method for mitigating a reduction in the resistance component R. In this case, however, it is necessary to additionally provide a land pattern for connection of the damping resistor, which increases a stray capacitance to deteriorate high-frequency characteristics. On the other hand, in the present embodiment, the land pattern need not be additionally provided, which does not lead to deterioration in high-frequency characteristics.

It is apparent that the present invention is not limited to the above embodiments, but may be modified and changed without departing from the scope and spirit of the invention.

What is claimed is:

1. A bias tee circuit connected between a common terminal and power supply and signal terminals, the bias tee circuit comprising:
    a capacitor inserted between the common terminal and the signal terminal; and
    first and second inductors inserted in series between the common terminal and the power supply terminal,
    wherein the first inductor is connected on a side of the common terminal,
    wherein the second inductor is connected on a side of the power supply terminal, and
    wherein the second inductor is higher in self-resonance frequency and lower in Q value than the first inductor.

2. The bias tee circuit as claimed in claim 1, wherein the second inductor is realized by a ferrite bead.

3. The bias tee circuit as claimed in claim 1,
    wherein the first inductor includes a first end connected to the common terminal and a second end, and
    wherein the second inductor includes a third end connected to the power supply terminal and a fourth end connected to the second end of the first inductor.

4. The bias tee circuit as claimed in claim 3, wherein the first end of the first inductor is directly connected to the common terminal without any other inductor interposed therebetween.

5. The bias tee circuit as claimed in claim 4, wherein the third end of the second inductor is directly connected to the power supply terminal without any other inductor interposed therebetween.

6. The bias tee circuit as claimed in claim 5, wherein the second end of the first inductor is directly connected to the fourth end of the second inductor without any other inductor interposed therebetween.

7. The bias tee circuit as claimed in claim 1, wherein no other inductors are connected between the common terminal and the power supply terminal except for the first and second inductors.

8. A PoC circuit comprising:
a first circuit group including a first power supply circuit, a first signal processing circuit, and a first bias tee circuit having a power supply terminal connected to the first power supply circuit, a signal terminal connected to the first signal processing circuit, and a common terminal;
a second circuit group including a second power supply circuit, a second signal processing circuit, and a second bias tee circuit having a power supply terminal connected to the second power supply circuit, a signal terminal connected to the second signal processing circuit, and a common terminal; and
a coaxial cable connected between the common terminal included in the first bias tee circuit and the common terminal included in the second bias tee circuit,
wherein each of the first and second bias tee circuits comprises:
a capacitor inserted between the common terminal and the signal terminal; and
first and second inductors inserted in series between the common terminal and the power supply terminal,
wherein the first inductor is connected on a side of the common terminal,
wherein the second inductor is connected on a side of the power supply terminal, and
wherein the second inductor is higher in self-resonance frequency and lower in Q value than the first inductor.

* * * * *